(12) United States Patent
Tikka et al.

(10) Patent No.: US 6,407,649 B1
(45) Date of Patent: Jun. 18, 2002

(54) MONOLITHIC FBAR DUPLEXER AND METHOD OF MAKING THE SAME

(75) Inventors: Pasi Tikka, Helsinki; Juha Ellä, Halikko; Jyrki Kaitila, Helsinki, all of (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/755,954

(22) Filed: Jan. 5, 2001

(51) Int. Cl.⁷ .............................. H03H 9/56; H03H 9/70; H03H 9/205

(52) U.S. Cl. ........................ 333/133; 333/191; 310/312; 29/25.35

(58) Field of Search .................... 333/133, 186–192; 310/312; 29/25.35

(56) References Cited

U.S. PATENT DOCUMENTS

| | | | |
|---|---|---|---|
| 3,549,414 A | * 12/1970 | Curran et al. | 333/191 X |
| 5,587,620 A | * 12/1996 | Ruby et al. | 310/346 |
| 5,692,279 A | * 12/1997 | Mang et al. | 29/25.35 |
| 5,714,917 A | 2/1998 | Ella | 332/144 |
| 5,873,154 A | 2/1999 | Ylilammi et al. | 29/25.35 |
| 5,894,647 A | * 4/1999 | Lakin | 29/25.35 |
| 5,910,756 A | 6/1999 | Ella | 333/133 |
| 6,060,818 A | 5/2000 | Ruby et al. | 310/363 |
| 6,107,721 A | * 8/2000 | Lakin | 310/321 |
| 6,262,637 B1 | * 7/2001 | Bradley et al. | 333/133 |
| 6,307,447 B1 | * 10/2001 | Barber et al. | 333/189 |
| 6,339,276 B1 | * 1/2002 | Barber et al. | 310/312 |

OTHER PUBLICATIONS

"Thin Film ZnO Based Bulk Acoustic Mode Filters," by C.W. Seabury, P.H. Kobrin, R. Addison and D.P. Havens from *IEEE MTT–S Digest*, Jun. 1997, pp. 181–184.

"Face–Mounted Piezoelectric Resonators," by W.E. Newell, from *Proceedings of the IEEE*, Jun. 1965, pp. 575–581.

"Acoustic Bulk Wave Composite Resonators," by K.M. Lakin and J.S. Wang, from *Applied Physics Letter*, Feb. 1, 1981, vol. 38, No. 3, pp. 125–127.

"Development of Miniature Filters for Wireless Applications," K.M. Lakin, G.R. Kline and K.T. McCarron, from *IEEE Transactions on Microwave Theory and Techniques*, Dec. 1995, vol. 43, No. 12, pp. 2933–2939.

"FBAR Technology Shrinks CDMA Handset Duplexers," by D. McNamara, from *Microwaves& RF*, Sep. 2000, pp. 71–79.

* cited by examiner

*Primary Examiner*—Benny Lee
*Assistant Examiner*—Barbara Summons
(74) *Attorney, Agent, or Firm*—Ware, Fressola, Van Der Sluys & Adolphson LLP (57) ABSTRACT

A monolithic bulk acoustic wave (BAW) duplexer, and a method for fabricating same, the duplexer having a, transmitter section as a first component filter and a receiver section as a second component filter, both component filters fabricated on a single substrate and both including at least one shunt BAW resonator and one series BAW resonator, each BAW resonator including a resonator section atop an isolation structure provided so as to separate the resonator section from the substrate, including: a patterned bottom electrode material for use as the bottom electrode of each of the resonators of the duplexer; a patterned piezoelectric material for use as the piezolayer of each of the resonators of the duplexer; a patterned top electrode material for use as the top electrode of each of the resonators of the duplexer; a tuning layer for the shunt resonator of each of the two component duplexer filters; and a tuning layer for both the series and shunt resonators of one of the two component duplexer filters. In some applications, each isolation structure is an acoustic mirror. Also in some applications, the duplexer further includes at least one planar spiral inductor provided in the course of depositing one or another layer of material in building up the duplexer, the planar spiral inductor having coils spiraling outward substantially in a plane from an innermost coil to an outermost coil.

10 Claims, 10 Drawing Sheets

MONOLITHIC FBAR DUPLEXER AND METHOD OF MAKING THE SAME

FIELD OF THE INVENTION

The present invention relates to thin film bulk acoustic wave resonators. More particularly, the present invention relates to bulk acoustic wave filters and bulk acoustic wave duplexers fabricated from thin film bulk acoustic wave resonators.

BACKGROUND OF THE INVENTION

Figure 1:
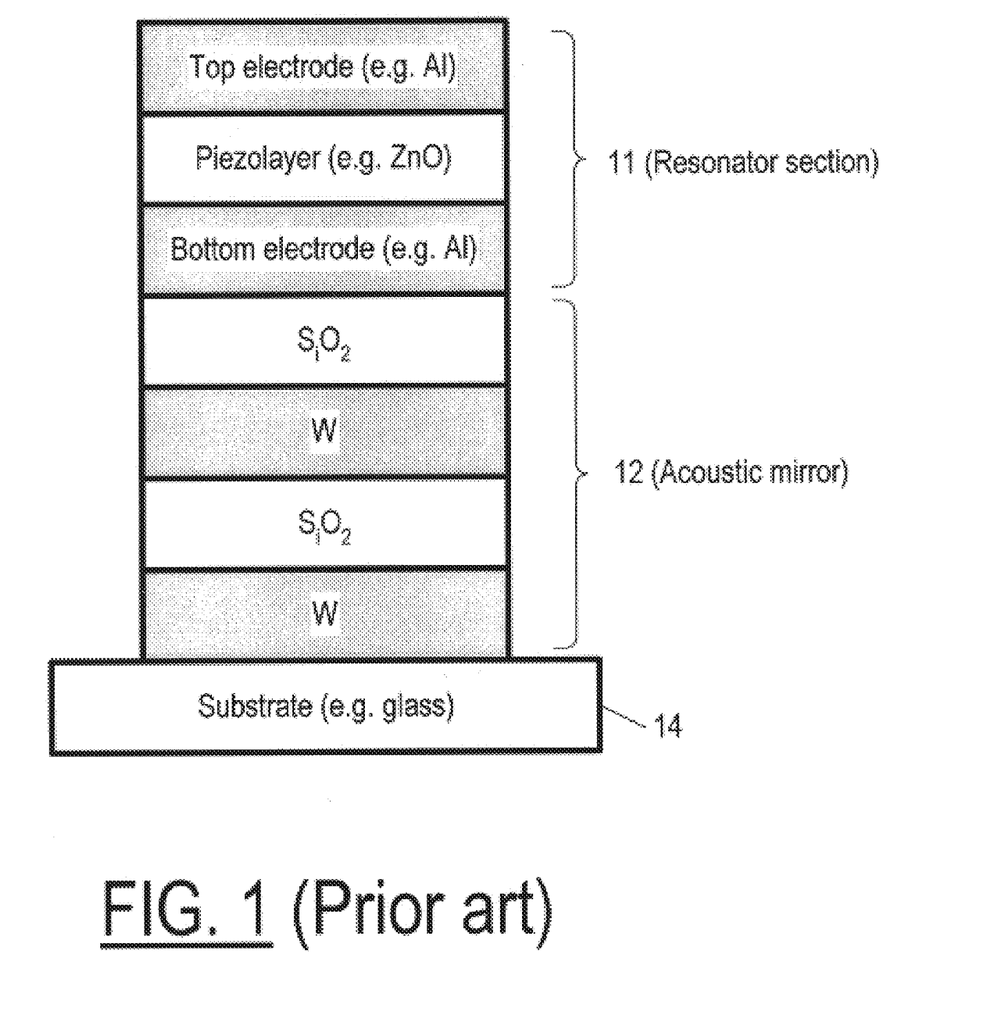
FIG. 1 is a schematic of an acoustic-mirror type BAW resonator, according to the prior art.

As shown in FIG. 1, a thin film bulk acoustic wave (BAW) resonator 10 includes a resonator section 11 based on a layer of piezoelectric material, such as ZnO or AlN, and some include an acoustic mirror 12 (where others, not shown, called bridge-type BAW resonators, include a membrane), all mounted on a substrate 14 made for example from glass. A BAW resonator converts sound waves to electric signals, and vice versa, and can be used as a filter in electronic circuits because of its frequency dependent electrical impedance.

Figure 4:
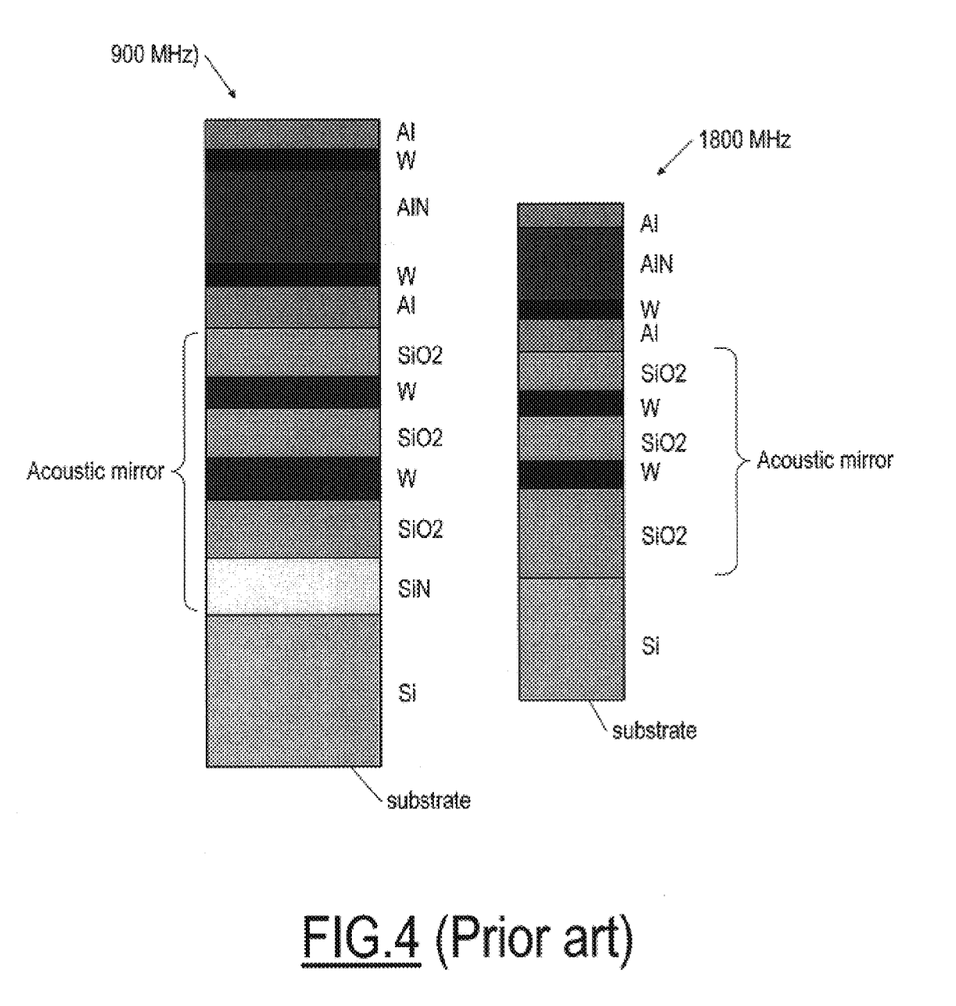
FIG. 4 shows two acoustic-mirror type BAW resonators, according to the prior art.

Typically, the acoustic mirror of an acoustic-mirror type of BAW resonator is formed from a combination of layers of materials of differing acoustic impedance. An acoustic mirror is built up on a substrate of for example glass by depositing its various layers of different materials so as to form a stack of layers of different materials on the substrate. Next, a bottom electrode is deposited on the acoustic mirror, and the piezoelectric material is then deposited on the bottom electrode forming a so called piezolayer. Finally, a top electrode is deposited on the piezolayer. The combination of top and bottom electrodes and the piezolayer is called the resonator section of the device. The acoustic mirror serves to reflect acoustic waves created by the piezolayer in response to a voltage applied across the electrodes, thereby isolating the substrate from the piezolayer. FIG. 4 shows the cross sections of two acoustic-mirror type BAW resonators fabricated to operate as parts of band pass filters at substantially different frequencies.

As mentioned above, besides BAW resonators including acoustic mirrors, it is known in the art to provide BAW resonators constructed on a membrane, with an air gap separating the resonator section from the substrate.

Figure 2:
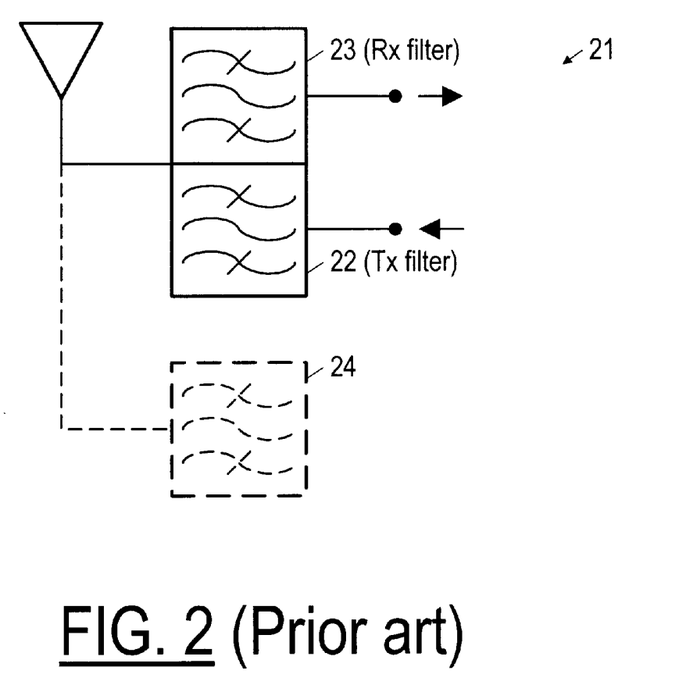
FIG. 2 is a schematic of a duplexer in a mobile phone according to the prior art, showing a transmitter filter and a receiver filter, and showing an optional additional filter.
Figure 3:
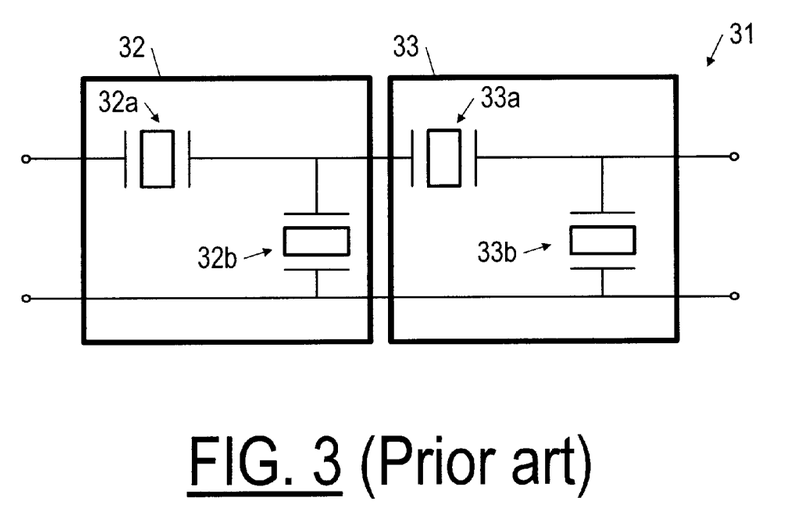
FIG. 3 is a schematic of a filter such as could be used for any of the filters of the duplexer of FIG. 2, showing a series combination of individual L-sections to make a ladder filter, each individual L-section consisting of a series BAW resonator and a shunt BAW resonator.

Both types of BAW resonators are used as components of filters making up duplexers in e.g. a mobile phone. As illustrated in FIG. 2, a mobile phone can include a duplexer 21, which in turn includes a transmitter (TX) filter 22 and a receiver (RX) filter 23. As shown in FIG. 3, such a filter may be a so-called ladder filter 31. A ladder filter, in general, includes at least one so-called L-section, an L-section including a series resonator and a shunt resonator. The filter 31 shown in FIG. 3 is therefore a ladder filter consisting of two L-sections 32 33 connected in series, each L-section 32 33 in turn including two resonators, a series resonator 32a 33a and a shunt resonator 32b 33b, the resonators of each individual L-section 32 33 being tuned to slightly different frequencies by fabricating one or more layers of the pair so as to have a slightly different thickness (Alternatively, of course, a TX filter 22 or a RX filter 23 of a duplexer 21 may consist of only a single combination 32 of a series resonator 32a and shunt resonator 32b, i.e. a single-stage ladder filter.)

A ladder filter, sometimes called an impedance element filter (IEF), generally consists of one or more so-called L-sections or L-segments, each L-section in turn including one series and one parallel resonator, and thus consisting of an even number of resonators. In some applications, however, a filter consists of an odd number of resonators. For example, a 2½-stage filter could have either two series resonators and three shunt resonators, or three series resonators and two shunt resonators. The present invention is not restricted to filters having an event number of resonators.

Besides a duplexer 21, a mobile phone can also include other filters (24 of FIG. 2) close in frequency to the duplexer frequencies.

The use of BAW resonators as components of filters in duplexers (then called FBAR duplexers) as taught by the art involves using two separate substrates for each filter, with external passive surface mounted devices (SMDs) as components.

What is needed is a way of fabricating on a single substrate the two filters for use in an FBAR duplexer. Ideally, other filters included as a component of the equipment using the duplexer (such as a mobile phone) and operating at a frequency near the frequencies of the duplexer could then also be advantageously fabricated on the same substrate. Such a fabricating would reduce the size of the equipment owing to the duplexer and filters operating near the frequencies of the duplexer, and would also, in principle, reduce the cost of fabricating the equipment.

SUMMARY OF THE INVENTION

Accordingly, the present invention provides, a monolithic bulk acoustic wave (BAW) duplexer, and a method for fabricating same, the duplexer having a transmitter section as a first component filter and a receiver section as a second component filter, both component filters fabricated on a single substrate and both including at least one shunt BAW resonator and one series BAW resonator, each BAW resonator including a resonator section atop an isolation structure provided so as to separate the resonator section from the substrate, including: a patterned bottom electrode material for use as the bottom electrode of each of the resonators of the duplexer; a patterned piezoelectric material for use as the piezolayer of each of the resonators of the duplexer; a patterned top electrode material for use as the top electrode of each of the resonators of the duplexer; a tuning layer for the shunt resonator of each of the two component duplexer filters; and a tuning layer for both the series and shunt resonators of one of the two component duplexer filters.

In a further aspect of the invention, the shunt tuning layer is provided in a location in each shunt resonator that is either: between the mirror and the bottom electrode; between the bottom electrode and the piezolayer; between the top electrode and the piezolayer; or on top of the top electrode.

In another, further aspect of the invention, the tuning layer for both the series and shunt resonators of one of the two component filters is provided in a location, in both the series and shunt resonators of the component filter, that is either: between the mirror and the bottom electrode; between the bottom electrode and the piezolayer; between the top electrode and the piezolayer; or on top of the top electrode.

In some applications, each isolation structure is an acoustic mirror.

In yet still even another aspect of the invention, the duplexer also includes at least one planar spiral inductor provided in the course of depositing one or another layer of material in building up the duplexer, the planar spiral inductor having coils spiraling outward substantially in a plane from an innermost coil to an outermost coil.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

Figure 5:
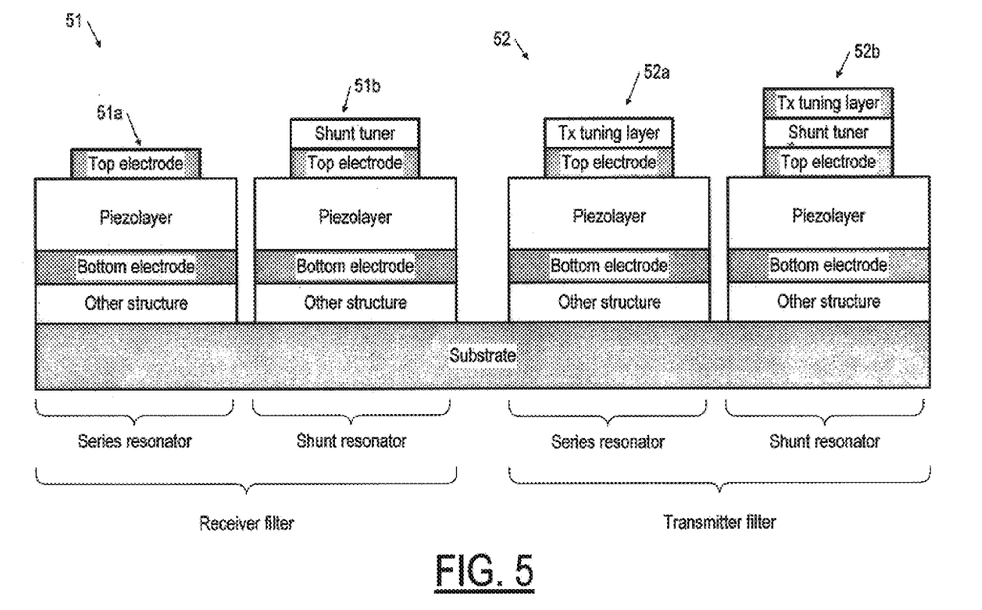
FIG. 5 shows the principal structure of different BAW resonators that might be used for the transmitter and receiver filters of a monolithic duplexer, the resonators differing essentially only by the addition of one or more different tuning layers.

Referring now to FIG. 5, a duplexer according to the invention includes a receiver filter 51 and a transmitter filter 52. Both filters include at least two resonators, a series 51a 52a and a shunt resonator 51b 52b. Each resonator of each filter includes a bottom electrode, a piezolayer, and a top electrode. Each resonator can be of either the acoustic-mirror type or the bridge type of resonator and so include additional structure (not shown). The shunt resonator of each filter includes a shunt resonator tuning layer that alters the frequency of the shunt resonator from that of the series resonator. In addition, both the series and shunt resonator of the transmitter filter include a transmitter tuning layer that alters the frequency of the transmitter filter (i.e. its center frequency) from that of the receiver filter. All four resonators are deposited on some additional structure and ultimately on a single substrate of for example glass. Because a single substrate is used, such a duplexer is called a monolithic duplexer.

Figure 6:
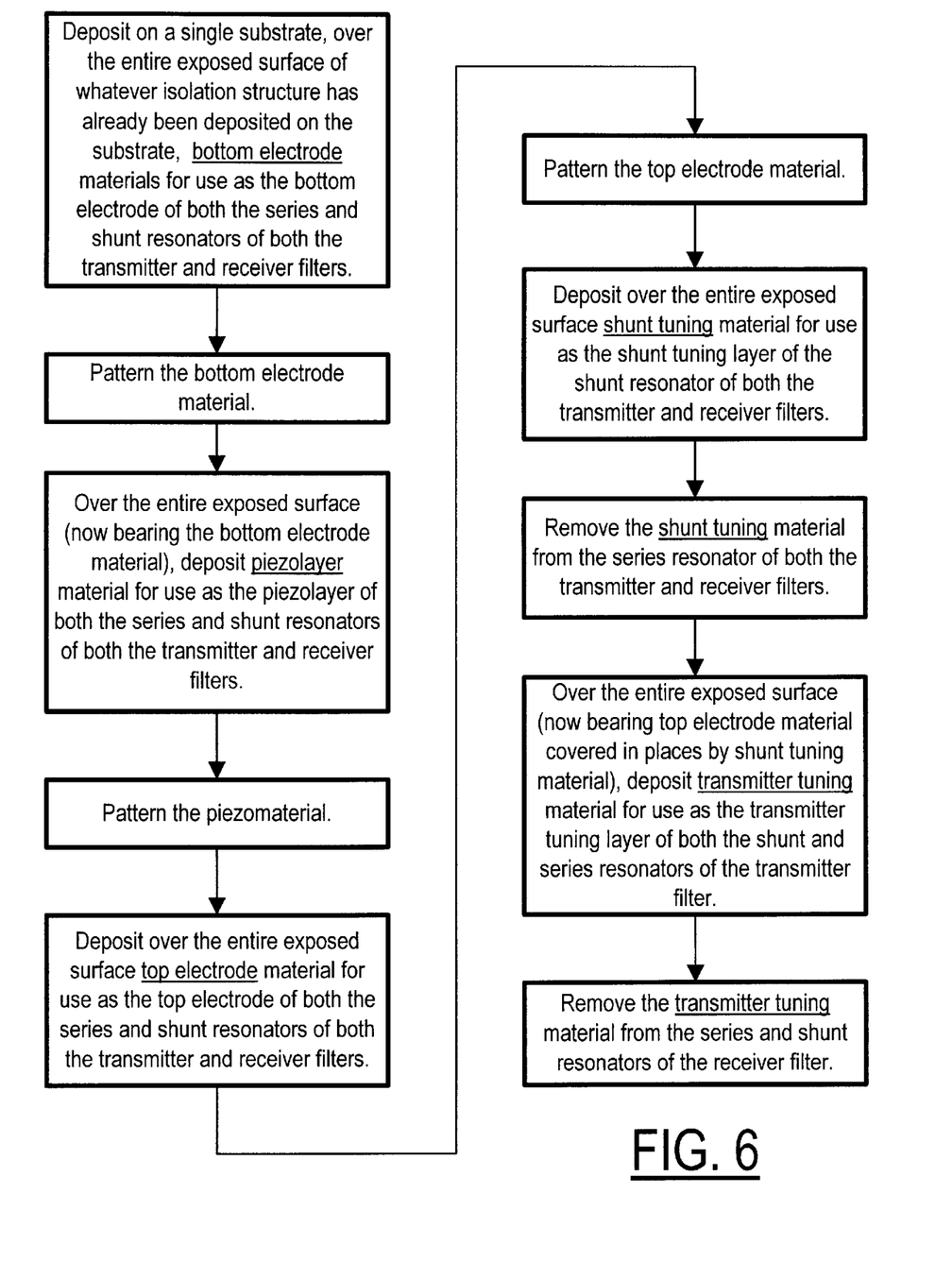
FIG. 6 is a flowchart illustrating the method according to the invention of fabricating a monolithic FBAR duplexer, i.e. of fabricating all of the BAW resonators of an FBAR duplexer on a single substrate.

FIG. 6 is a flowchart of a method according to the invention for fabricating the monolithic FBAR duplexer of FIG. 5. The method involves depositing the transmitter tuning layer over the entire surface of the built up substrate, and then removing the tuning layer from the receiver filter components. The flow chart of FIG. 6, as well as the flowcharts of FIGS. 8 and 12, do not expressly include many of the details of the fabrication process, such as cleaning of the wafer (substrate, from which individual chips are sawed), or depositing-possible adhesion layers. The flowcharts of FIGS. 6, 8, and 12 should be understood to be at a general level. Patterning of each layer after it is deposited and before the next is deposited, i.e. a layer-by-layer patterning, is preferred, but patterning can also be done all at once, after all of the layers are deposited. Also any combination is in principle possible; for example in some cases two consecutively deposited layers may be patterned in one step after the deposition.

Figure 7:
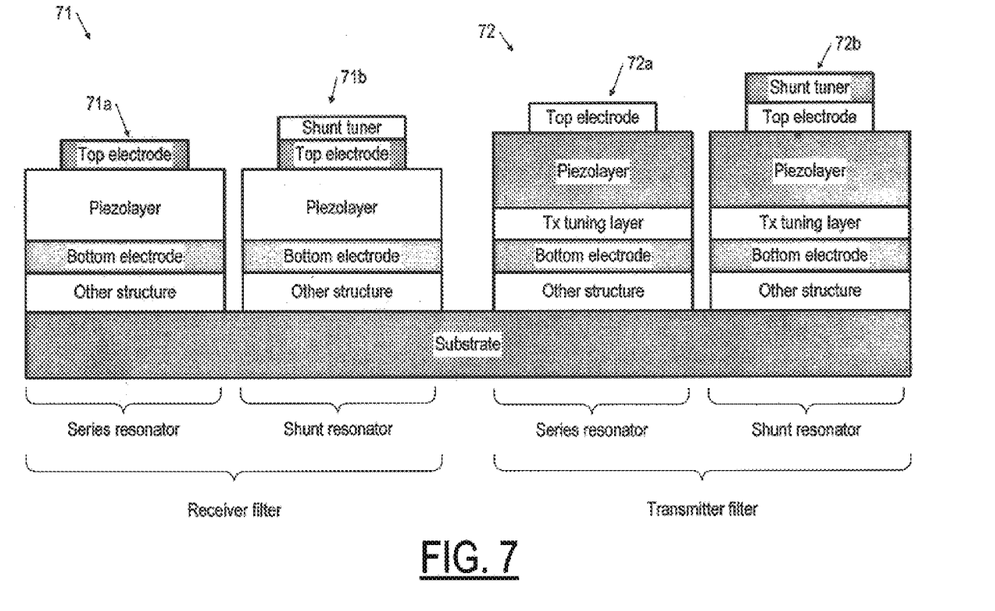
FIG. 7 shows the same principal structure of different BAW resonators of a monolithic duplexer as in FIG. 5, except that the transmitter tuning layer is deposited between the piezolayer and the bottom electrode, instead of on top of the top electrode.
Figure 8:
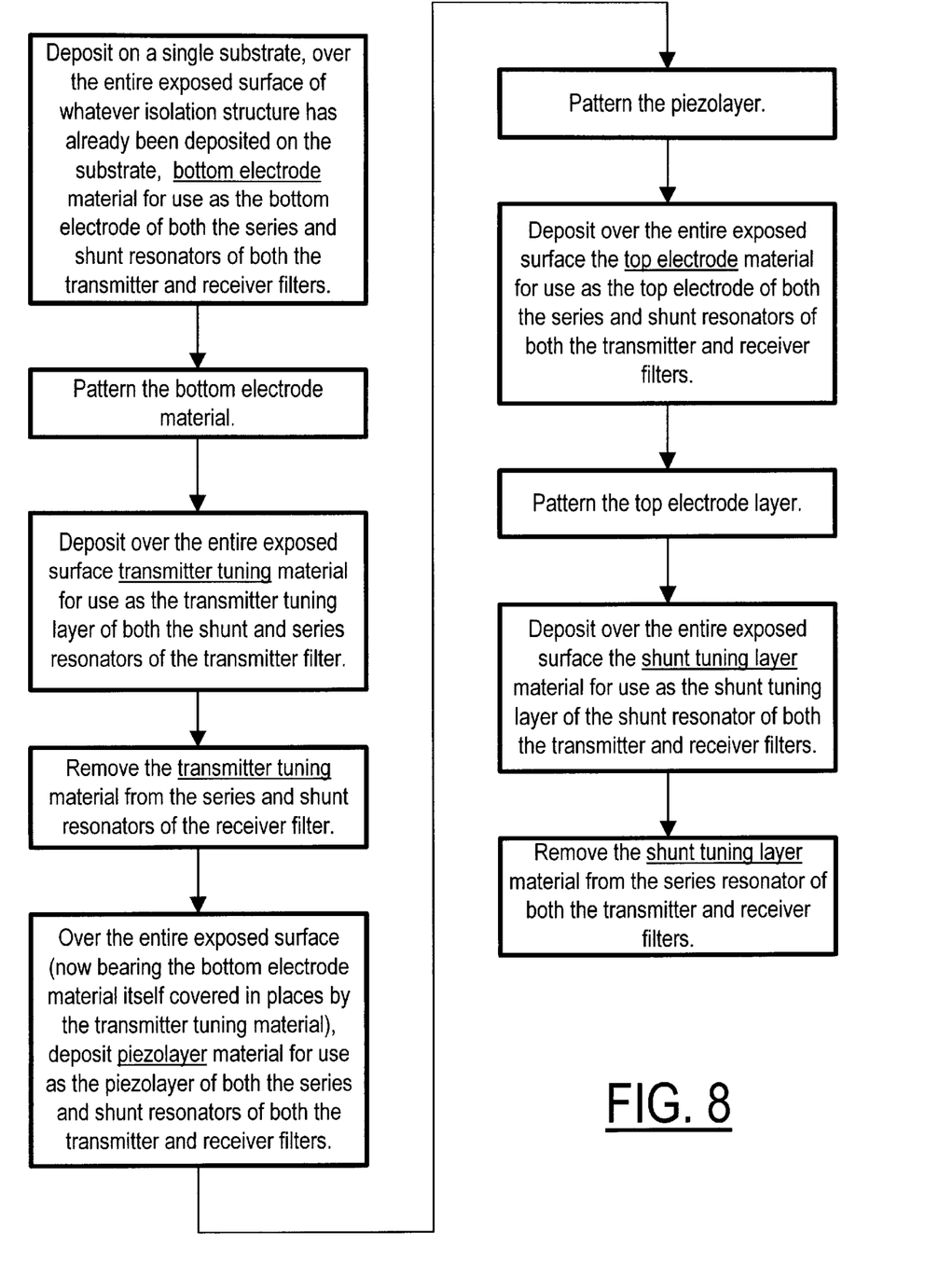
FIG. 8 is a flowchart illustrating how to fabricate a monolithic FBAR duplexer such as illustrated in FIG. 7.

Referring now to FIG. 7, another duplexer according to the invention again includes a receiver filter 71 and a transmitter filter 72, and both filters again include two resonators, a series resonator 71a 72a and a shunt resonator 71b 72b, as in the duplexer illustrated in FIG. 5. However, the duplexer here is made with the transmitter tuning layer deposited between the piezolayer and the bottom electrode, instead of on top of the top electrode. FIG. 8 is a flowchart of a process according to the invention for fabricating such a monolithic FBAR duplexer. A tuning layer, for either a shunt resonator or for (both resonators of) the transmitter, can be either a metal or a dielectric layer. A metal tuning layer must be patterned (removed from between resonators); otherwise, such a tuning layer would short out all the resonators.

In case of a metal tuning layer for tuning either a shunt resonator or the transmitter, the tuning layer can be in any of four locations: between the mirror and the bottom electrode; between the bottom electrode and the piezolayer; between the top electrode and the piezolayer; or on top of the top electrode. A metal tuning layer has the added benefit of slightly reducing the resistive losses of the electrodes.

On the other hand, if a dielectric material is used for the tuning layer, then the tuning layer must be under the bottom electrode or on top of the top electrode; otherwise, such a tuning layer would reduce the electric field inside the piezolayer, which would result in a decrease in the coupling coefficient. If such a tuning layer were used to tune down the transmitter filter, then it could be left unpatterned in the area of this filter. If, however, it is placed on top of the top electrode, then it should be patterned. In case of a monolithic duplexer, it is of course also possible to combine two such tuning methods, so that for example a dielectric layer is used to tune the transmitter filter, and a metal layer is used to tune the shunt resonator of each filter.

Materials used for tuning layers (either for transmitter tuning layers or for shunt resonator tuning layers) are either metals (e.g. aluminum, copper) or dielectrics (e.g. silicon dioxide, silicon nitride). The removal of material from selected regions of the wafer is done by methods known in the art. Such selective material removal, which is usually performed in any integrated circuit (IC) process, is called patterning.

Besides the embodiments illustrated in FIGS. 6 and 8, the invention also comprehends using the same layers in both the transmitter and receiver filters and adding a tuning layer to the filter that operates at the lower frequency (usually the transmitter), as opposed to growing a thick tuning layer over the entire substrate (as built up by having deposited one or more layers of the filters), a tuning layer suitable for the lower frequency part, and then selectively etching away a predetermined amount of the tuning layer from the higher frequency part.

Figure 9:
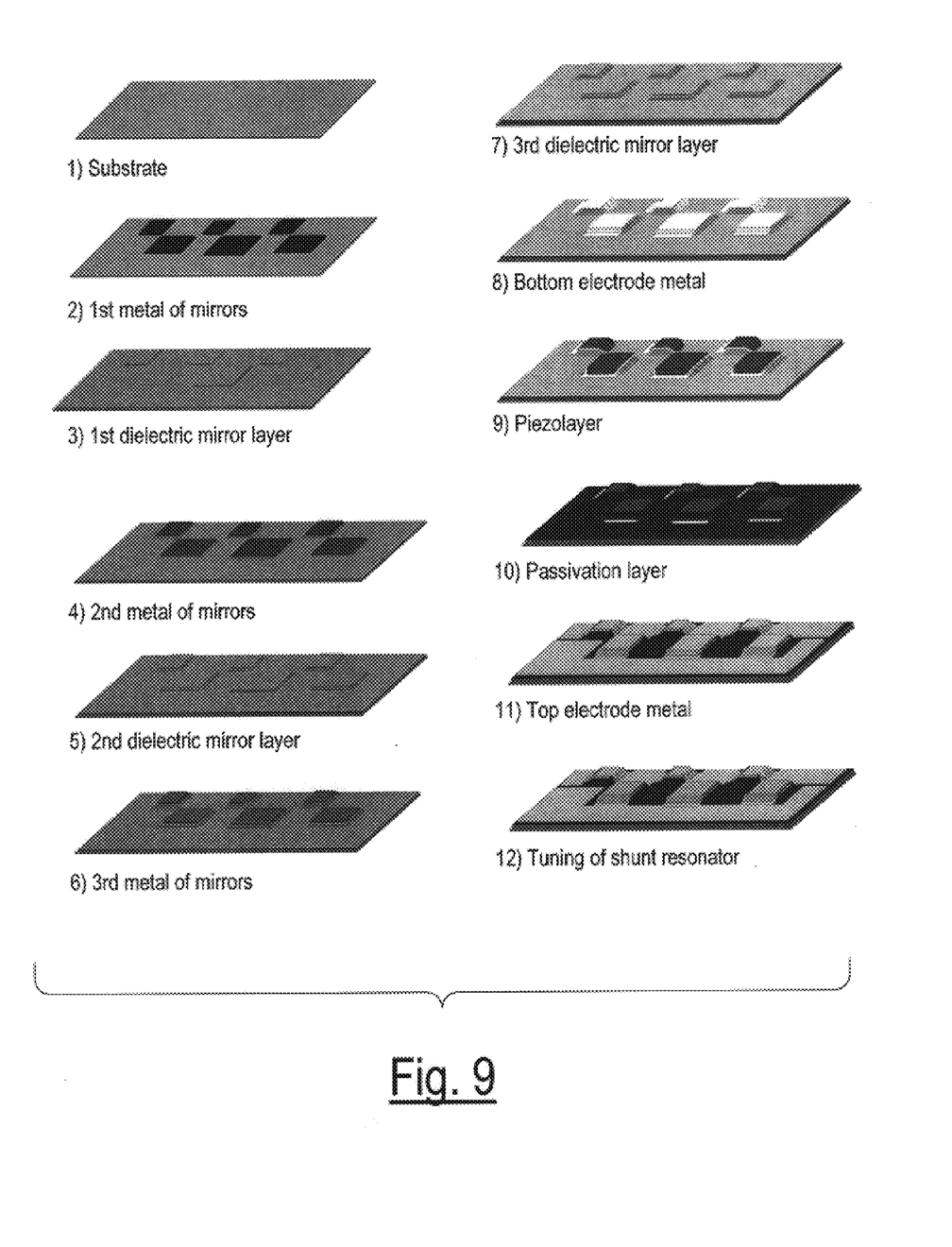
FIG. 9 is an illustration of one process for fabricating several acoustic mirror type BAW resonators (forming a three-stage L-section filter) on a single substrate, and so illustrating the techniques used in fabricating a monolithic BAW duplexer according to the invention, the process shown here being one in which, from among the layers of the acoustic mirror material, only the metallic layers are patterned (i.e. removed from some selected areas of the face of the filter), not the dielectric layers (although other layers making up the filter are also patterned, including the bottom and top electrode)

Referring now to FIG. 9, an exemplary process is shown for fabricating a filter, a filter which could be either the TX or RX filter of a duplexer. What is shown is the fabrication of three L-sections (connected in series) of a filter on a single substrate, as opposed to both a TX and a RX filter on the same substrate, but the techniques of fabrication for the three L-section filter are the same as for a monolithic BAW duplexer. The fabrication is similar to the fabrication of normal active IC's. The layers of the structures being made are deposited on top of each other, and most of the layers are also patterned using conventional lithography and etching. (Patterning here means the selective removal of material from certain regions on the wafer; it does not mean the use of localized ion beam.) In the method shown in FIG. 9, successive layers making up the acoustic mirror are deposited in turn, and in so doing, after depositing each metallic layer and before depositing the next dielectric layer, the metallic layer material is selectively removed from between each region where a resonator section will be built up. The deposition of the metals is usually done by sputtering; the dielectric layers can be grown for example by Chemical Vapor Deposition (CVD)or Plasma Enhanced CVD. As mentioned above, the selective removal (patterning) of the metallic layers can be done by either wet or dry etching. With either etching method, it is possible to obtain sloped edges of the metallic layers, which is helpful in avoiding step coverage problems. For the dielectric (low acoustic impedance) layers, the preferred materials are SiO2 or Si3N4, and the preferred materials for the metallic (high impedance) layers are W or Mo, although other materials can also be used. When the piezolayer is deposited, it extends across the entire face of the substrate (on top of the layers already deposited). The piezolayer can either be left unpatterned (not selectively removed), for example when fabricating a two-stage balanced filter (except for providing for vias, i.e. holes in a dielectric layer created by patterning the layer so that when a metal is then deposited on the dielectric layer it will fill the hole, thus providing a connection through the dielectric layer), or the piezolayer can be removed everywhere except on top of each mirror stack.

Still referring to FIG. 9, as can be seen in the pictures above (step 2, 4 and 6), the metal layers of the mirrors are patterned to form separate stacks underneath each individual resonator. If this were not done then there would be a large capacitance from the bottom electrode of each resonator to the metal mirror layers, which would then provide for a parasitic, capacitive coupling from one resonator to another.

Still referring to FIG. 9, the tuning of the shunt resonators (step 12) and the transmit part overall tuning material can be either a metal or a dielectric layer. If a metal is used, the tuning layer must be patterned, otherwise it would short out all the resonators. A metal tuning layer (for either shunt or transmitter tuning) is typically provided in one or another of four locations: 1) in an acoustic-mirror type of BAW resonator, between the mirror and the bottom electrode; 2) between the bottom electrode and the piezolayer; 3) between the top electrode and the piezolayer; and 4) on top of the top electrode. A metal tuning layer is advantageous in that it reduces slightly the resistive losses of the electrodes.

If a dielectric material is used for the tuning layer, then the tuning layer must be located under the bottom electrode or on top of top electrode, otherwise it would reduce the electric field inside the piezolayer, thus also decreasing the coupling coefficient. If such a layer is used to tune down the whole transmitter filter, then it could be left unpatterned in the area of this filter. However, if such a tuning layer is provided on top of the top electrode, then it will have to be patterned to the extent that vias are provided to electrically connect the underlying electrodes to the rest of the duplexer circuit. (If a dielectric tuning layer on top of the top electrode is left fully unpatterned, then all the metal layers will be covered by it everywhere. Since some holes through such a tuning layer are needed to get the electric signal from the outside world to the electrode metals, at least vias must be patterned at the locations of the signal pads for wire bonds or flip chip bumps.) For a monolithic duplexer, it is of course also possible to combine the two tuning method, by e.g. using a dielectric layer as the transmitter overall tuning (tuning both the shunt and series resonators of the transmitter filter) and using a metal layer as the shunt tuning (tuning the shunt BAW resonator of the transmitter filter and the shunt BAW resonator of the receiver filter).

The response of a duplexer can sometimes be improved by an additional inductance in series with one or more of the shunt resonators, shifting down the series resonance of these resonators. (The parallel resonance is not affected.) The prior art teaches the use of such additional inductance, but not in monolithic form. Therefore, according further to the invention, besides providing for both the receiver filter and the transmitter filter of a duplexer on the same substrate, in some applications one or more coils (planar spiral inductors) serving as components of the duplexer are integrated onto the same substrate. A ladder filter response typically includes two attenuation maxima, i.e. two so-called notches, one on each side of the passband for the filter. The lower notch can be enhanced (widened) by the use of an inductor to coincide in frequency with the TX band, thus providing more attenuation from TX to RX. The integration of such an inductor (in the form of a planar spiral inductor) onto the same substrate as the other duplexer components (and in particular the BAW resonators) reduces the overall size of the duplexer. Inductors made in a thin-film process, i.e. planar spiral inductors, usually exhibit quite low quality values (Q-values), because of large resistive losses and parasitic capacitance or other parasitic elements associated with materials between the inductors and the substrate. In case of fabricating a BAW duplexer, some of the metals used in the fabrication can be fairly thick and can be used in fabricating the notch-enhancing planar spiral inductors so that the (planar) coils are thicker than in prior art thin-film fabrication processes. A thicker coil has lower resistance to current, so that resistive losses are reduced by fabricating such coils as part of the fabrication of a monolithic duplexer according to the invention. In addition, BAW devices usually benefit from having a high resistivity substrate (i.e. the substrate is usually an electrical insulator), and the resonator sections as well as any coil deposited on an acoustic mirror-type of structure are fairly well electrically isolated from the substrate by the mirror dielectrics, thus reducing the strength of any parasitic elements down to the substrate and so improving the Q-value of a monolithic notch-enhancing coil.

Figure 10:
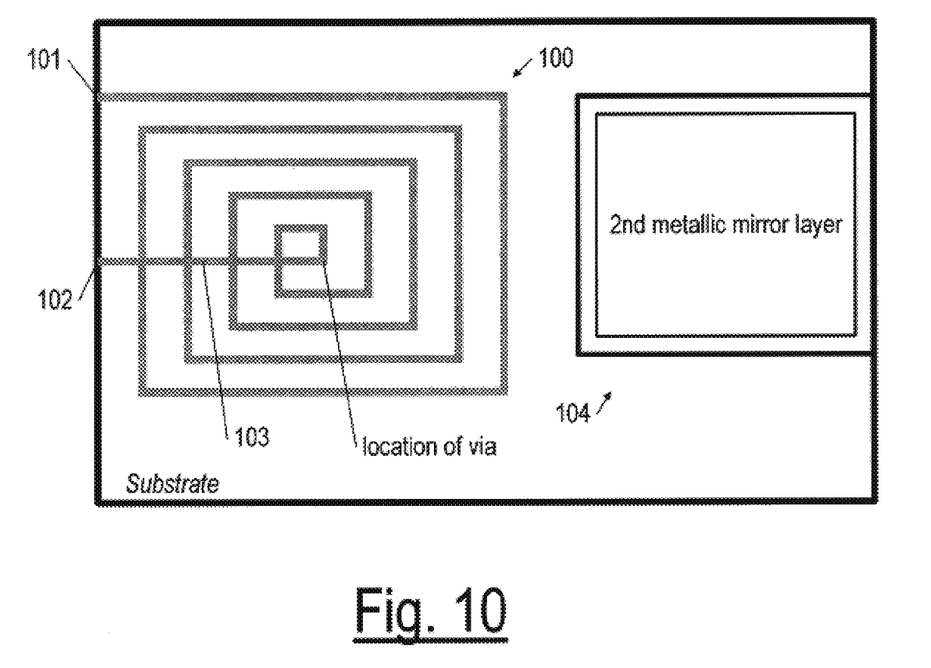
FIG. 10 is a plan view of a portion of a monolithic FBAR duplexer according to the invention, in an embodiment including a planar spiral inductor.
Figure 11:
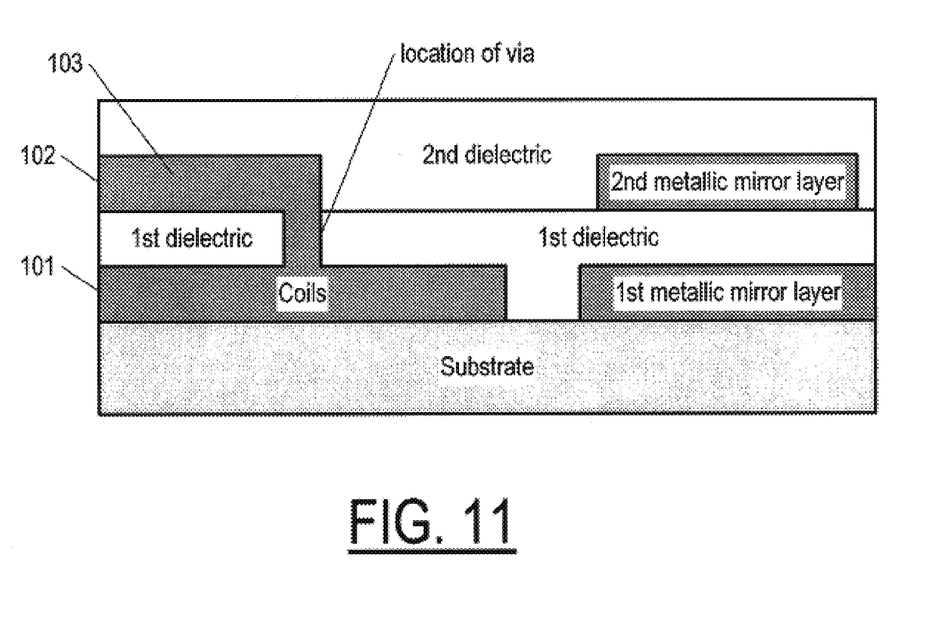
FIG. 11 is an elevation view corresponding to FIG. 10.

Referring now to FIGS. 10 and 11, a planar spiral inductor 100 of the type provided according to the invention is shown on the same substrate as a duplexer. FIG. 10 shows a planar coil 100 and two metallic layers of an acoustic mirror used as an isolation structure, but for clarity, does not show dielectric layers deposited between the metallic layers. FIG. 11 shows that the metallic layers are separated by dielectric material, deposited as described below in two layers. The planar spiral inductor is shown as having two terminals 101 102. One of the terminals is connected to the innermost coil by an arm 103 extending across the outer coils. The arm 103 must be insulated from the outer coils so that it does not short out the outer coils where it crosses them. The arm is therefore provided after laying down a layer of dielectric material 104 on top of the coils, with a via to allow connecting the arm to the innermost coil.

Figure 12:
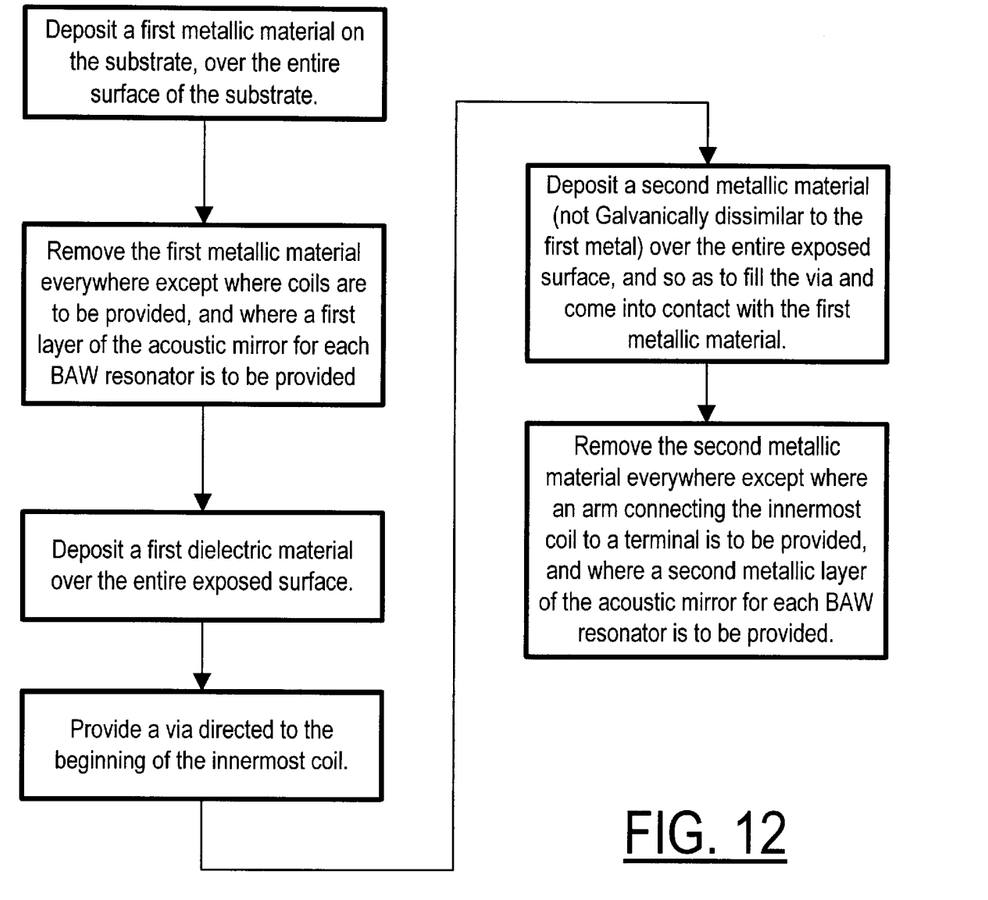
FIG. 12 is a flowchart illustrating one method of fabrication, according to the invention, of a monolithic FBAR duplexer including a planar spiral inductor.

FIG. 12 illustrates the fabrication, according to the preferred embodiment of the invention, of a monolithic FBAR duplexer including at least one planar spiral inductor on the same substrate as the BAW resonators of the duplexer. In the embodiment of FIG. 12, after depositing the first metallic layer of an acoustic mirror over the entire surface of the substrate, the metallic layer is patterned to provide the first mirror layer and the first layer of the coil, the patterning including: applying photoresist; exposing and developing it; a subsequent etch step; and finally removing the photoresist remaining after the etch step. Next, the dielectric material for use as the first dielectric layer of the acoustic mirror is deposited over the entire exposed surface (which in some places is the surface of the substrate, and in others is a metallic material that is either for use as a metallic layer of an acoustic mirror, or for use as the planar spiral inductor coils). This dielectric need not be selectively removed, and in the preferred embodiment, is not removed anywhere, except that to provide a connection from a terminal to the innermost coil (i.e., in FIG. 10, from terminal 102, via arm 103, to the innermost coil), a via is provided in the dielectric layer. Then a second metallic material is deposited everywhere, and extends through the via onto the first metallic material at the beginning of the innermost coil. The second metallic material should be a type of metal that will not corrode because of coming into contact with the metal of the first metallic layer, i.e. ideally, it is the same or a similar kind of metal as the second metallic material. Using a patterning process similar to that used for the first metallic layer, the second metallic material is removed everywhere except where the arm connecting the innermost coil to a terminal is to be provided, and where the second metallic layer of the acoustic mirror for each BAW resonator is to be provided. Fabrication of the duplexer BAW resonators then continues, layer by layer, patterning each layer of metallic material and the piezoelectric material, but leaving as deposited, each layer of dielectric material.

The planar spiral inductor can also be fabricated from either the top or bottom electrode metal, or even from some additional metal not included in the basic process (specifically such as from gold, which might be deposited on the substrate after the resonator fabrication).

It is to be understood that the above-described arrangements are only illustrative of the application of the principles of the present invention. Numerous modifications and alternative arrangements may be devised by those skilled in the art without departing from the spirit and scope of the present invention, and the appended claims are intended to cover such modifications and arrangements.

What is claimed is:

1. A method of fabricating a monolithic bulk acoustic wave (BAW) duplexer having a transmitter section as a first component filter and a receiver section as a second component filter, both component filters fabricated on a single substrate and both including at least one shunt BAW resonator and one series BAW resonator, each BAW resonator including a resonator section atop an isolation structure provided so as to separate the resonator section from the substrate, the method comprising the steps of:

a) depositing and patterning bottom electrode material for use as the bottom electrode of each of the resonators of the duplexer;
   b) depositing and patterning piezoelectric material for use as the piezolayer of each of the resonators of the duplexer;
   c) depositing and patterning top electrode material for use as the top electrode of each of the resonators of the duplexer;
   d) providing a tuning layer for the shunt resonator of each of the two component duplexer filters; and
   e) providing a tuning layer for both the series and shunt resonators of one of the two component duplexer filters.

2. The method of claim 1, wherein the shunt tuning layer is deposited in a location in each shunt resonator selected from the group consisting of: between the isolation structure and the bottom electrode; between the bottom electrode and the piezolayer; between the top electrode and the piezolayer; and on top of the top electrode.

3. The method of claim 1, wherein the tuning layer for both the series and shunt resonators of one of the two component filters is deposited in a location, in both the series and shunt resonators of the component filter, selected from the group consisting of: between the isolation structure and the bottom electrode; between the bottom electrode and the piezolayer; between the top electrode and the piezolayer; and on top of the top electrode.

4. The method of claim 1, wherein each isolation structure is an acoustic mirror.

5. The method of claim 4, further comprising the step of providing the acoustic mirror and also providing at least one planar spiral inductor having coils spiraling outward substantially in a plane from an innermost coil to an outermost coil, the step of providing the acoustic mirror and planar spiral inductor comprising in turn the steps of:

a) depositing on the substrate, over the entire surface of the substrate, a first metallic material;
   b) removing the first metallic material everywhere except where the coils are to be provided, and where the first layer of the acoustic mirror for each BAW resonator is to be provided;
   c) depositing a first dielectric material over the entire exposed surface;
   d) providing a via directed to the beginning of the innermost coil;
   e) depositing a second metallic material over the entire exposed surface and so as to fill the via and come into contact with the first metallic material; and
   f) removing the second metallic material everywhere except where an arm connecting the innermost coil to a terminal is to be provided, and where a second metallic layer of the acoustic mirror for each BAW resonator is to be provided.

6. A monolithic bulk acoustic wave (BAW) duplexer having a transmitter section as a first component filter and a receiver section as a second component filter, both component filters fabricated on a single substrate and both including at least one shunt BAW resonator and one series BAW resonator, each BAW resonator including a resonator section atop an isolation structure provided so as to separate the resonator section from the substrate, comprising:

a) a patterned bottom electrode material for use as the bottom electrode of each of the resonators of the duplexer;

b) a patterned piezoelectric material for use as the piezolayer of each of the resonators of the duplexer;

c) a patterned top electrode material for use as the top electrode of each of the resonators of the duplexer;

d) a tuning layer for the shunt resonator of each of the two component duplexer filters; and     e) a tuning layer for both the series and shunt resonators of one of the two component duplexer filters.

7. The monolithic BAW duplexer of claim 6, wherein the shunt tuning layer is provided in a location in each shunt resonator selected from the group consisting of: between the isolation structure and the bottom electrode; between the bottom electrode and the piezolayer; between the top electrode and the piezolayer; and on top of the top electrode.

8. The monolithic BAW duplexer of claim 6, wherein the tuning layer for both the series and shunt resonators of one of the two component filters is provided in a location, in both the series and shunt resonators of the component filter, selected from the group consisting of: between the isolation structure and the bottom electrode; between the bottom electrode and the piezolayer; between the top electrode and the piezolayer; and on top of the top electrode.

9. The monolithic BAW duplexer of claim 6, wherein each isolation structure is an acoustic mirror.

10. The monolithic BAW duplexer of claim 6, further comprising at least one planar spiral inductor included in one or another layer of material deposited on the single substrate, the planar spiral inductor having coils spiraling outward substantially in a plane from an innermost coil to an outermost coil.

\* \* \* \* \*

UNITED STATES PATENT AND TRADEMARK OFFICE
CERTIFICATE OF CORRECTION

PATENT NO. : 6,407,649 B1
DATED : June 18, 2002
INVENTOR(S) : Tikka et al.

It is certified that error appears in the above-identified patent and that said Letters Patent is hereby corrected as shown below:

<u>Title page,</u>
Item [57], ABSTRACT,
Line 2, after "a", "," should be deleted.

Signed and Sealed this

Twenty-first Day of January, 2003

JAMES E. ROGAN
*Director of the United States Patent and Trademark Office*